United States Patent

[11] 3,619,736

[72] Inventor Takeo Miyata
Atsugi, Japan
[21] Appl. No. 48,018
[22] Filed June 22, 1970
[45] Patented Nov. 9, 1971
[73] Assignee Mitsumi Electric Company, Limited
Tokyo, Japan

[54] ALLOY JUNCTION TRANSISTOR AND A METHOD OF MAKING THE SAME

3 Claims, 9 Drawing Figs.

[52] U.S. Cl. .......... 317/235, 317/239, 29/576
[51] Int. Cl. .......... H01l 3/12, H01l 7/34
[50] Field of Search .......... 317/234, 235, 239

[56] References Cited

UNITED STATES PATENTS

| | | | |
|---|---|---|---|
| 2,644,852 | 7/1953 | Dunlap, Jr. | 317/239 X |
| 2,733,390 | 1/1956 | Scanlon | 317/239 |
| 2,757,323 | 7/1956 | Jordan et al. | 317/239 |
| 2,781,481 | 2/1957 | Armstrong | 317/239 |
| 2,877,396 | 3/1959 | Armstrong et al. | 317/239 X |
| 2,939,205 | 6/1960 | Sutherland et al. | 317/239 X |

*Primary Examiner*—James D. Kallam
*Attorney*—Hill, Sherman, Meroni, Gross & Simpson

ABSTRACT: An alloy junction transistor in which an indium dot serving as an emitter impurity and an indium antimony alloy dot containing 1 to 0.01 percent by weight of antimony relative to indium and serving as a collector impurity are alloyed with an N-type germanium wafer serving as the base to form emitter and collector junctions and the base grounded current amplification factor (emitter-collector current amplification factor) is greater than 1.

A method of making an alloy junction transistor having a base grounded current amplification factor exceeding 1 comprising the steps of alloying the indium dot and the indium-antimony dot with the N-type germanium wafer to form emitter and collector junctions therebetween, in which the heating temperature for alloying the indium-antimony alloy dot with the wafer is controlled such that it is relatively rapidly raised up to a value high enough to cause the contact portion of the wafer and the alloy dot to be liquid-phase and is held at this value for a predetermined time, thereafter being gradually lowered in accordance with an upwardly convex temperature curve or upwardly convex polygonal line.

INVENTOR
Takeo Miyata
BY
Hill, Sherman, Meroni, Gross & Simpson
ATTORNEY

INVENTOR
Takeo Miyata
BY
Hill, Sherman, Meroni, Gross & Simpson
ATTORNEY

ALLOY JUNCTION TRANSISTOR AND A METHOD OF MAKING THE SAME

BACKGROUND OF THE INVENTION

1. Field of the Invention

This invention relates to an alloy junction transistor and a method of making the same, and more particularly to a novel alloy junction transistor characterized by that its base grounded current amplification factor (emitter-collector current amplification factor) $\alpha$ exceeds 1 and to a method for the manufacture of such a transistor.

2. Description of the Prior Art

Heretofore, an alloy junction transistor has been proposed which is of the type that indium dots serving as an emitter and a collector impurity are respectively alloyed with an N-type germanium wafer serving as the base to form emitter and collector junctions therebetween but its base grounded current amplification factor $\alpha$ is less than 1 for the reason that carriers injected from the emitter into the base are destroyed by recombination while travelling in the base. Accordingly, in the case of employing the conventional alloy junction transistor for amplification purpose, its emitter is grounded so as to utilize the emitter grounded current amplification factor $\beta$, in which case, however, the signal is amplified with the input and output being opposite in phase. This imposes a severe limitation on the design of an amplifier circuit employing the prior art alloy junction transistor.

Further, a point-contact-type transistor has also been proposed whose base grounded current amplification factor $\alpha$ exceeds 1. However, the point-contact-type transistor is not practical because of various defects such as unsuitableness for mass production, unstable characteristics, many noises and so on.

SUMMARY OF THE INVENTION

Accordingly, the principal object of this invention is to provide a novel alloy junction transistor whose base grounded current amplification factor (emitter-collector current amplification factor) exceeds 1.

An alloy junction transistor according to an aspect of this invention is produced by alloying with an N-type germanium wafer serving as the base a metal functioning as an emitter impurity, preferably indium and an indium-antimony alloy serving as a collector impurity. In this case the indium-antimony alloy contains 1 to 0.01 percent by weight of antimony relative to indium for the following reasons.

*a* With respect to the base grounded amplification factor $\alpha$ to the emitter current, a relationship $\alpha>1$ can be obtained over a wide range of the emitter current.

*b* It is possible to produce an output impedance equal to or higher than that obtainable with the prior art alloy junction transistor of the type that an indium dot serving as an emitter impurity and that serving as a collector impurity are alloyed with an N-type germanium wafer functioning as the base and, further, the base grounded current amplification factor $\alpha$ is greater than 1.

*c* Outside of the aforementioned range of the weight percentage of antimony, 1 the relationship $\alpha>1$ cannot be obtained and if obtained, it is possible only within a narrow emitter current range and 2 the output impedance is very low and hence the transistor is unpractical for amplification use.

Although not clarified in detail, the reason why the base grounded current amplification factor $\alpha$ exceeds 1 over a wide emitter current range in the novel alloy junction transistor of this invention is considered to be due to the fact that a hook-shaped junction is formed on the side of the collector by the growing speed dependency of the segregation coefficients of indium acting as an acceptor and antimony serving as a donor.

Another object of this invention is to provide a method of making a novel alloy junction transistor whose base grounded current amplification factor exceeds 1.

One example of the method of making an alloy junction transistor according to another aspect of this invention comprises the steps of alloying with an N-type germanium wafer serving as the base of metal, preferably an indium dot serving as an emitter impurity and alloying with the wafer a metal acting as a collector impurity which is an indium-antimony alloy dot containing 1 to 0.01 percent by weight of antimony relative to indium.

In accordance with one example of an improved method of making an alloy junction transistor according to this invention, in the above-mentioned process of alloying the collector impurity metal with the germanium wafer temperature is raised relatively rapidly high enough to cause the contact portions of the germanium wafer and the indium-antimony alloy dot with each other to be liquid-phase and is held high for a predetermined period of time, thereafter being gradually lowered based upon an upwardly convex curve or an upwardly convex polygonal line.

In the improved method of making an alloy junction transistor it must be born in mind that in the process of alloying the indium-antimony alloy dot serving as a collector impurity with the germanium wafer, temperature control is achieved for gradual cooling based upon the upwardly convex curve or upwardly convex polygonal line. The reason for such temperature control is based upon the facts clarified in the foregoing items *a*, *b* and *c* in connection with the reasons for which the indium-antimony alloy dot contains 1 to 0.01 percent by weight of antimony relative to indium and it is especially because the effect of the item *a* is greatly improved, as compared with the case of effecting no temperature control. Although not clarified in detail, the reason why such temperature control leads to enhancement of the effect of the item *a* is considered to be due to the fact that the hook-shaped junction presumed to be formed on the collector side by the growing speed dependency of the segregation coefficients of indium and antimony is well formed. That is, it is considered to result from the formation of an excellent hook-shaped junction based upon the fact that indium is much segregated at the beginning of the gradual cooling and then antimony is gradually segregated, thereby to form a recombination layer whose side on which indium has been much segregated on the side of wafer.

Other objects, features and advantages of the present invention will become apparent from the following description taken in conjunction with the accompanying drawings.

DESCRIPTION OF THE PREFERRED EMBODIMENTS

Figure 1:
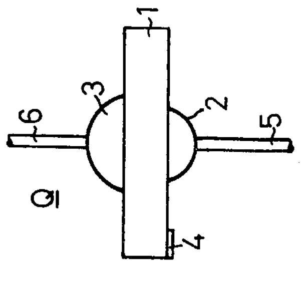
FIG. 1 is a schematic diagram showing one example of an alloy junction transistor produced according to this invention.

A description will be given of one example of the alloy junction transistor of this invention together with a method of making the same. The manufacture begins with preparation of an N-type germanium wafer having a resistivity of 1.5 ohm cm. and a thickness of about 7.5 microns, an indium dot having a diameter of, for example, 260 microns and an indium-antimony alloy dot containing 0.1 percent by weight of antimony relative to indium and having a diameter of approximately 500 microns. Following the method of making a usual alloy junction method, the indium dot and the indium-antimony alloy dot are respectively mounted on both sides of the N-type germanium wafer by means of a suitable jig and then the wafer with the dots mounted thereon is heated in a vacuum furnace for about ten minutes at a temperature of about 550° C. high enough to cause the contact areas of the wafer and the dots with each other to be liquid-phase, thereafter being gradually cooled at a certain temperature gradient, thus providing an alloy junction transistor. In FIG. 1 reference character Q indicates generally thus produced alloy junction transistor and reference numeral 1 designates its N-type germanium wafer, 2 an indium dot after alloyed and 3 an indium-antimony alloy dot after alloyed. A base electrode 4 is mounted on the wafer 1 and emitter and collector lead wires 5 and 6 are respectively connected to the dots 2 and 3 as shown in the figure.

Figure 2:
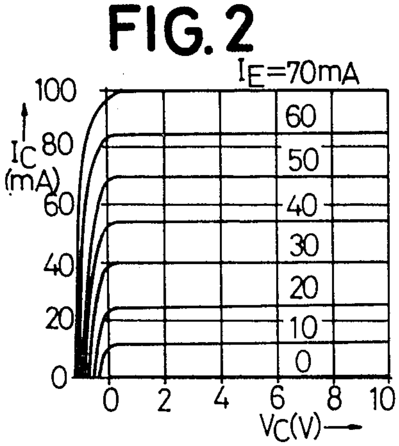
FIG. 2 is a graph showing the collector current to collector voltage characteristic of the alloy junction transistor of FIG. 1 with its emitter current being used as a parameter.
Figure 3:
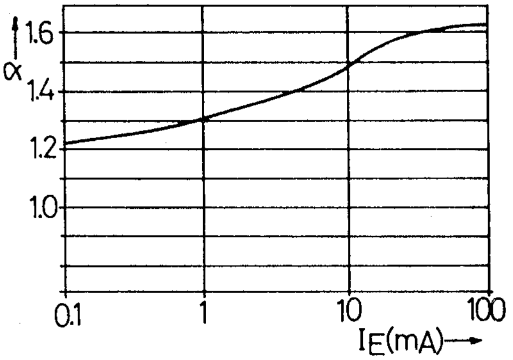
FIG. 3 is a graph illustrating the relation of the base grounded current amplification factor of the alloy junction transistor of FIG. 1 to its emitter current.

FIG. 2 shows the collector current $I_C$ to collector voltage $V_C$ characteristics of such an alloy junction transistor with its emitter current $I_E$ being used as a parameter. It appears from the figure that this invention provides the relationship $\alpha>1$ over a wide range of the emitter current. Further, it has been found that the base grounded current amplification factor $\alpha$ is greater than 1 and that the output impedance is fully high. In fact, plotting of the base grounded current amplification factor $\alpha$ relative to the emitter current $I_E$ showed that the alloy junction transistor of this invention had an excellent characteristic such that $\alpha$ exceeded 1.2 over a wide range of the emitter current $I_E$ from 0.1 to 100 milliamperes as depicted in FIG. 3.

Figure 4A:
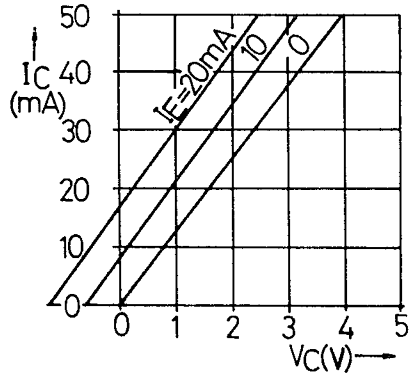
FIGS. 4A to 4D are graphs, similar to FIG. 2, respectively showing the collector current to collector voltage characteristics of alloy junction transistors produced not according to this invention.
Figure 4B:
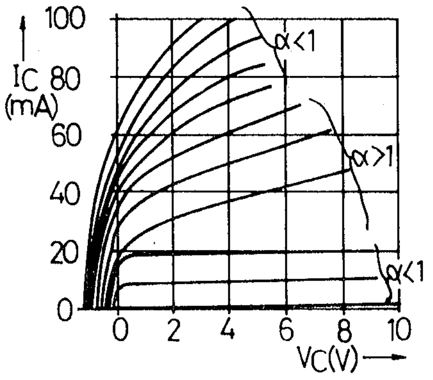
Figure 4C:
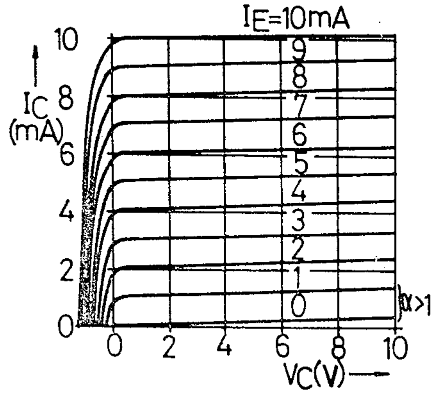

In the case of an alloy junction transistor which was the same as the foregoing example except in that 10 percent by weight of antimony was contained in the alloy relative to indium, the collector current $I_C$ to collector voltage $V_C$ characteristic with the emitter current $I_E$ being used as a parameter was as shown in FIG. 4A. It was found that the collector junction was ohmic and that no transistor characteristic was exhibited. With the amount of antimony contained in the alloy being altered to 1.1 percent by weight relative to indium, the same characteristic as the above one was as illustrated in FIG. 4B. In this case the base grounded current amplification factor $\alpha$ was greater than 1 within a very narrow emitter current range about 30 milliamperes but $\alpha$ was smaller than 1 outside of such an emitter current range and the output impedance was very low in the range of $\alpha>1$. With an indium-antimony alloy dot containing 0.009 percent by weight of antimony relative to indium, the collector current $I_C$ to collector voltage $V_C$ characteristic was as shown in FIG. 4C. In this case the base grounded current amplification factor $\alpha$ was greater than 1 with a very narrow emitter current range about 1 milliampere and outside of this range $\alpha$ was smaller than 1 as will be seen from the figure.

Figure 4D:
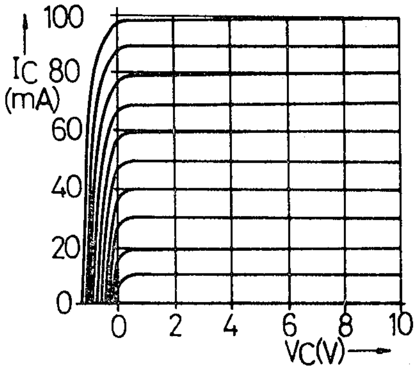

FIG. 4D shows the collector current $I_C$ to collector voltage $V_C$ characteristic, with the emitter current $I_E$ being used as a parameter, of an alloy junction transistor employing an indium-antimony alloy dot containing 0.001 percent by weight of antimony relative to indium. In this case no emitter current range was obtained in which $\alpha>1$ and the characteristic of this transistor was similar to conventional alloy junction transistor of $\alpha$ 0.98.

Figure 5:
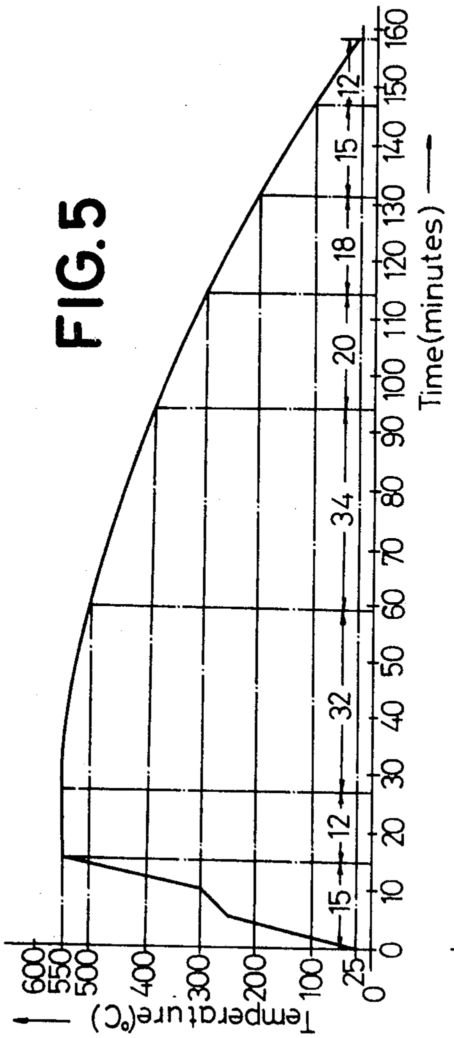
FIGS. 5 and 6 are graphs showing the relationship of temperature to time in an alloying process in the manufacture of the alloy junction transistor, for explaining this invention.

A description will be given of the method of making the alloy junction transistor according to this invention. The manufacture started with the preparation of an N-type germanium wafer having a resistivity of approximately 1.5 ohm cm. and a thickness of about 50 microns, an indium dot having a diameter of 250 microns and an indium-antimony alloy dot containing 0.1 percent by weight of antimony relative to indium and having a diameter of about 350 microns. The indium dot and the indium-antimony dot were respectively mounted on both sides of the N-type germanium wafer by means of a jig as usual and then the wafer with the dots mounted thereof was placed in a furnace and heated for alloy treatment of them with the heating temperature being controlled in accordance with a temperature curve shown in FIG. 5. Namely, the wafer assembly was initially heated from room temperature (25° C.) up to a temperature of about 550° C. and held at this temperature for about 12 minutes, thereafter being cooled down to about 500° C. in 32 minutes or so, from thence down to about 400° C. in approximately 34 minutes, from thence down to about 300° C. in about 20 minutes, from thence down to about 200° C. in 18 minutes or so, from thence down to 100° or so in about 15 minutes and finally down to room temperature in approximately 12 minutes.

An alloy junction transistor thus produced had a base grounded current amplification factor $\alpha$ of about 3.5.

Figure 6:
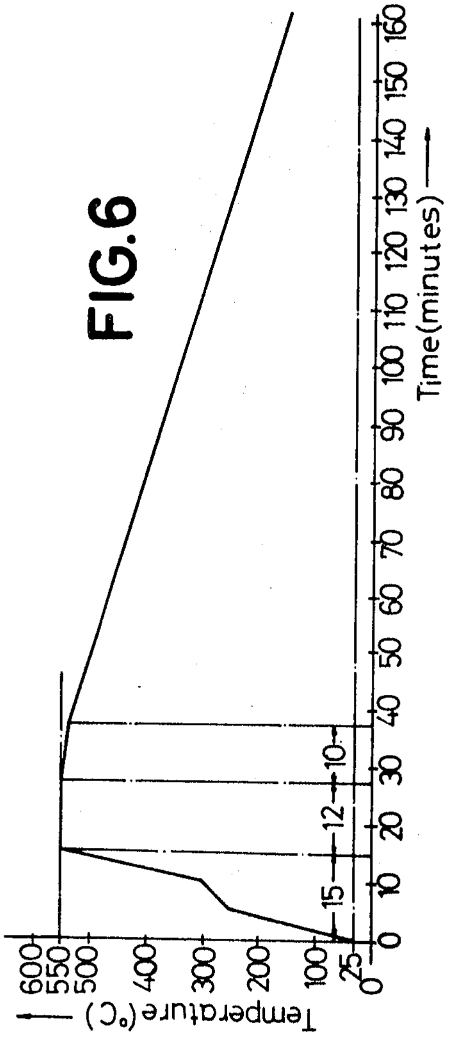

In another example of this invention the same N-type germanium wafer, indium dot, indium-antimony alloy dot as those in the above example were placed in the furnace in the same manner as in the foregoing example and then heated in accordance with a temperature curve shown in FIG. 6. Namely, the wafer assembly was initially heated from room temperature (25° C.) up to a temperature of about 550° C. in about 15 minutes and held at this temperature for about 12 minutes, thereafter being gradually cooled at a temperature gradient of about 1° C. per minute for about 10 minutes and then gradually cooled down to room temperature at a temperature gradient of approximately 2° C. per minute.

The resulting alloy junction transistor had a base grounded current amplification factor was about 2.0.

By the way, in the case of heating the same N-type germanium wafer, indium dot and indium-antimony alloy dot as in the foregoing example in accordance with a temperature curve (a downwardly convex curve or upwardly concave curve) employed in the prior art, the base grounded current amplification factor $\alpha$ of the resulting alloy junction transistor was greater than 1 but the value of $\alpha$ was only within a range of 1.2 to 1.6.

With an alloy junction transistor which was similar to those of this invention described above except in that the indium-antimony alloy dot contained 10 percent by weight of antimony relative to indium, it has been found that the collector junction was ohmic and did not exhibit any transistor characteristic. With the amount of antimony contained in the alloy dot being altered to 1.1 percent by weight relative to indium, the resulting characteristic presented the relationship $\alpha>1$ within a very narrow emitter current range about 30 milliamperes but $\alpha$ was smaller than 1 outside of such a range. Further, in the case of the indium-antimony alloy dot containing 0.009 percent by weight of antimony relative to indium, the resulting characteristic provided the relationship $\alpha>1$ within a very narrow emitter current range about 1 milliampere and outside of this range $\alpha$ was smaller than 1. With an indium-antimony alloy dot containing 0.001 by weight of antimony relative to indium, the resulting characteristic did not ever present the relationship $\alpha>1$.

Although the foregoing description has been made of the case where the indium dot and the indium-antimony alloy dot are alloyed with the N-type germanium wafer, this type of transistor having a base grounded current amplification factor $\alpha$ exceeding 1 relatively greatly can be obtained even by adding respectively lead and tin as carrier metals to indium dot and the indium-antimony alloy dot.

In the foregoing examples indium dot serving as an emitter impurity and the indium-antimony alloy dot acting as a collector impurity are alloyed with the N-type germanium wafer but a similar transistor having a base grounded current amplification factor $\alpha$ exceeding 1 could be produced even by substituting indium with an emitter impurity metal capable of acting as an acceptor, for example, gallium. However, it has been ascertained desirable to use indium as the emitter impurity because it has an affinity with the N-type germanium wafer.

While the foregoing description has been given in connection with the case where the metal serving as the emitter impurity and the indium-antimony alloy acting as the collector impurity are simultaneously alloyed with the wafer, the same transistor as above described could be produced by sequentially alloying them with the wafer.

It will be apparent that many modifications and variations may be effected without departing from the scope of the novel concepts of this invention.

I claim as my invention:

1. An alloy PN-junction transistor comprising an N-type germanium wafer forming the base region thereof, a mass of predominantly accepter metal fused into said wafer at a first position for forming an emitter region of the transistor therein, a mass of indium-antimony alloy containing antimony within a range of 0.01 to 1 by weight of indium fused to said wafer at a second position for forming a collector region of the transistor therein, whereby the base grounded current amplification 2. A method of making an alloy PN-junction transistor having a base grounded current amplification factor exceeding one comprising the steps of:

alloying the mass of predominantly accepter metal into an N-type germanium wafer at a first position for forming the base-emitter PN junction of the transistor, and alloying an indium-antimony alloy containing antimony within a range of 0.01 to 1 by weight of indium into said wafer at a second position for forming the collector-base PN junction of the transistor.

3. A method of making an alloy junction transistor as claimed in claim 3 wherein said alloying of the indium-antimony alloy with the N-type germanium wafer occurs at a temperature which is relatively rapidly increased up to a value high enough to cause the contact portion of the N-type germanium wafer and the indium-antimony alloy to become liquid-phase and the temperature is held at such value for a predetermined time and the temperature is thereafter gradually lowered so that the temperature drops slower at hotter temperatures than its does at lower temperatures. L

* * * * *

UNITED STATES PATENT OFFICE
CERTIFICATE OF CORRECTION

Patent No. 3,619,736 Dated November 9, 1971

Inventor(s) TAKEO MIYATA

It is certified that error appears in the above-identified patent and that said Letters Patent are hereby corrected as shown below:

Column 2, line 4, change "of" to --a--.

Column 3, line 60, after "to" insert --a--;

line 61, after "$\alpha$" insert --≒--;

line 72, change "thereof" to --thereon--.

Column 5, line 10, change "0.01" to --0.01%--; change "1" to --1%--;

line 12, after "amplification" insert --factor of said transistor is greater than one.--

Column 6, line 3, change "0.01" to --0.01%--; change "1" to --1%--;

line 7, change "3" to --2--;

line 15, delete "L".

Signed and sealed this 18th day of July 1972.

(SEAL)
Attest:

EDWARD M.FLETCHER,JR.
Attesting Officer

ROBERT GOTTSCHALK
Commissioner of Patents

ORM PO-1050 (10-69)

USCOMM-DC 60376-P69
☆ U.S. GOVERNMENT PRINTING OFFICE : 1969 O—366-334